(12) United States Patent
Agranov et al.

(10) Patent No.: US 10,015,471 B2
(45) Date of Patent: Jul. 3, 2018

(54) ASYMMETRIC ANGULAR RESPONSE PIXELS FOR SINGLE SENSOR STEREO

(75) Inventors: Gennadiy Agranov, San Jose, CA (US); Dongqing Cao, San Jose, CA (US); Avi Yaron, Palo Alto, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 797 days.

(21) Appl. No.: 13/404,319

(22) Filed: Feb. 24, 2012

(65) Prior Publication Data
US 2013/0038691 A1 Feb. 14, 2013

Related U.S. Application Data

(60) Provisional application No. 61/522,876, filed on Aug. 12, 2011.

(51) Int. Cl.
*H04N 13/02* (2006.01)
*H04N 5/369* (2011.01)

(52) U.S. Cl.
CPC ....... *H04N 13/0228* (2013.01); *H04N 5/3696* (2013.01)

(58) Field of Classification Search
CPC ....... H01L 27/146; H01L 27/14; H04N 13/04; H04N 13/02; H04N 13/0228; H04N 5/3696
USPC .......................................................... 348/46
See application file for complete search history.

(56) References Cited

U.S. PATENT DOCUMENTS

| | | | |
|---|---|---|---|
| 6,166,768 A | 12/2000 | Fossum et al. | |
| 6,396,873 B1 * | 5/2002 | Goldstein | G02B 21/22 250/201.7 |
| 6,714,240 B1 * | 3/2004 | Caswell | H04N 5/33 348/144 |
| 6,856,407 B2 | 2/2005 | Knighton | |
| 6,933,978 B1 * | 8/2005 | Suda | G02B 7/34 348/345 |
| 7,290,880 B1 | 11/2007 | Yaron et al. | |
| 7,646,943 B1 * | 1/2010 | Wober | G02B 6/421 250/227.11 |
| 7,935,560 B2 | 5/2011 | Anderson et al. | |

(Continued)

OTHER PUBLICATIONS

Adelson and Wang, "Single Lens Stereo with a Plenoptic Camera", IEEE PAMI, vol. 14, No. 2, (Feb. 1992).

(Continued)

*Primary Examiner* — Deirdre Beasley
(74) *Attorney, Agent, or Firm* — Treyz Law Group, P.C.; Joseph F. Guihan

(57) ABSTRACT

Depth sensing imaging pixels include pairs of left and right pixels forming an asymmetrical angular response to incident light. A single microlens is positioned above each pair of left and right pixels. Each microlens spans across each of the pairs of pixels in a horizontal direction. Each microlens has a length that is substantially twice the length of either the left or right pixel in the horizontal direction; and each microlens has a width that is substantially the same as a width of either the left or right pixel in a vertical direction. The horizontal and vertical directions are horizontal and vertical directions of a planar image array. A light pipe in each pixel is used to improve light concentration and reduce cross talk.

19 Claims, 15 Drawing Sheets

(56) References Cited

U.S. PATENT DOCUMENTS

| | | | |
|---|---|---|---|
| 8,049,801 B2* | 11/2011 | Kusaka | G02B 7/36 257/291 |
| 8,525,906 B2* | 9/2013 | Ui | H01L 27/14627 348/49 |
| 8,730,545 B2 | 5/2014 | Endo et al. | |
| 8,947,572 B2 | 2/2015 | Venezia et al. | |
| 9,106,826 B2 | 8/2015 | Aoki | |
| 2002/0117605 A1* | 8/2002 | Alden | F41H 3/00 250/208.1 |
| 2003/0211405 A1 | 11/2003 | Venkataraman | |
| 2004/0012698 A1* | 1/2004 | Suda | H01L 27/14618 348/315 |
| 2005/0051860 A1* | 3/2005 | Takeuchi | H01L 27/14627 257/436 |
| 2005/0057655 A1 | 3/2005 | Duesman et al. | |
| 2005/0190453 A1* | 9/2005 | Dobashi | H01L 27/1462 359/619 |
| 2006/0066739 A1* | 3/2006 | Kobayashi | H04N 5/335 348/294 |
| 2006/0249804 A1* | 11/2006 | Mouli | H01L 27/14627 257/432 |
| 2007/0023801 A1 | 2/2007 | Hynecek | |
| 2007/0090423 A1 | 4/2007 | Park | |
| 2008/0018662 A1 | 1/2008 | Gazeley | |
| 2008/0080028 A1* | 4/2008 | Bakin | G06T 1/0007 358/514 |
| 2008/0180558 A1 | 7/2008 | Watanabe | |
| 2008/0217718 A1 | 9/2008 | Mauritzson | |
| 2008/0259202 A1* | 10/2008 | Fujii | H04N 5/23212 348/345 |
| 2008/0274581 A1 | 11/2008 | Park | |
| 2008/0278820 A1* | 11/2008 | Li | G02B 3/0018 359/621 |
| 2009/0200589 A1 | 8/2009 | Qian et al. | |
| 2009/0230394 A1 | 9/2009 | Nagaraja et al. | |
| 2009/0244514 A1* | 10/2009 | Jin | G01C 3/08 356/4.01 |
| 2009/0284731 A1* | 11/2009 | Jin | G01B 11/22 356/4.01 |
| 2010/0020209 A1 | 1/2010 | Kim | |
| 2010/0033829 A1* | 2/2010 | Wippermann | G02B 27/01 359/623 |
| 2010/0060717 A1 | 3/2010 | Gunnewiek | |
| 2010/0091161 A1* | 4/2010 | Suzuki | H01L 27/14609 348/302 |
| 2010/0117177 A1 | 5/2010 | Yun | |
| 2010/0123771 A1 | 5/2010 | Moon | |
| 2010/0128109 A1* | 5/2010 | Banks | G01S 7/4816 348/46 |
| 2010/0150538 A1 | 6/2010 | Ono et al. | |
| 2010/0238330 A1* | 9/2010 | Hirota | H01L 27/14621 348/273 |
| 2010/0245656 A1* | 9/2010 | Fujii | H04N 5/23212 348/345 |
| 2010/0265381 A1* | 10/2010 | Yamamoto | G02B 27/0025 348/335 |
| 2010/0290674 A1 | 11/2010 | Kim | |
| 2011/0018974 A1* | 1/2011 | Wang | H04N 13/0214 348/49 |
| 2011/0019049 A1* | 1/2011 | Jin | H01L 27/14609 348/308 |
| 2011/0019184 A1* | 1/2011 | Iwane | G02B 7/36 356/123 |
| 2011/0025904 A1 | 2/2011 | Onuki et al. | |
| 2011/0042552 A1* | 2/2011 | Furuya | H01L 27/14621 250/208.1 |
| 2011/0109776 A1* | 5/2011 | Kawai | H01L 27/14625 348/273 |
| 2011/0199506 A1* | 8/2011 | Takamiya | G02B 7/34 348/222.1 |
| 2011/0199602 A1* | 8/2011 | Kim | G01B 11/22 356/5.01 |
| 2011/0249161 A1 | 10/2011 | Takagi | |
| 2011/0309236 A1 | 12/2011 | Tian et al. | |
| 2012/0019695 A1 | 1/2012 | Qian et al. | |
| 2012/0043634 A1 | 2/2012 | Kurihara | |
| 2012/0056073 A1* | 3/2012 | Ahn | H01L 27/14609 250/208.1 |
| 2012/0133809 A1* | 5/2012 | Yamada | H01L 27/14623 348/294 |
| 2012/0175501 A1 | 7/2012 | Lee | |
| 2012/0193515 A1* | 8/2012 | Agranov | G01S 3/782 250/208.1 |
| 2012/0212581 A1 | 8/2012 | Nagata et al. | |
| 2012/0212654 A1* | 8/2012 | Nagata | H04N 5/23212 348/247 |
| 2012/0267747 A1* | 10/2012 | Watanabe | H01L 27/14683 257/443 |
| 2012/0268634 A1* | 10/2012 | Fukuda | H01L 27/14605 348/302 |
| 2013/0020620 A1* | 1/2013 | Wober | G02B 6/4204 257/292 |
| 2013/0038691 A1* | 2/2013 | Agranov | H04N 5/35545 348/272 |
| 2013/0128087 A1* | 5/2013 | Georgiev | H04N 5/2254 348/307 |
| 2013/0181309 A1 | 7/2013 | Johnson et al. | |
| 2013/0182158 A1 | 7/2013 | Kobayashi et al. | |
| 2013/0222552 A1 | 8/2013 | Agranov et al. | |
| 2013/0222553 A1* | 8/2013 | Tsuchita | 348/46 |
| 2013/0222662 A1 | 8/2013 | Sakurai et al. | |
| 2013/0256510 A1 | 10/2013 | Lyu | |
| 2013/0271646 A1 | 10/2013 | Hamano | |
| 2014/0103410 A1 | 4/2014 | Chnen et al. | |
| 2014/0192248 A1 | 7/2014 | Kishi | |
| 2014/0218580 A1 | 8/2014 | Mayer et al. | |
| 2014/0253905 A1* | 9/2014 | Kim | G01C 15/06 356/5.01 |
| 2015/0001589 A1 | 1/2015 | Tazoe et al. | |
| 2015/0062422 A1 | 3/2015 | Stern | |
| 2015/0312461 A1 | 10/2015 | Kim et al. | |
| 2016/0099273 A1 | 4/2016 | Agranov et al. | |
| 2017/0094260 A1 | 3/2017 | Agranov et al. | |

OTHER PUBLICATIONS

"An Objective Look at FSI and BSI", An Aptina Technology White Paper, 2010 (6 pages) [Retrieved on Jun. 18, 2012], Retrieved from the Internet <URL: http://www.aptina.com/news/FSI-BSI-WhitePaper.pdf>.

* cited by examiner

ASYMMETRIC ANGULAR RESPONSE PIXELS FOR SINGLE SENSOR STEREO

CROSS REFERENCE TO RELATED APPLICATIONS

This application claims priority of U.S. Provisional Patent Application Ser. No. 61/522,876, filed Aug. 12, 2011, which is incorporated herein by reference.

FIELD OF THE INVENTION

The present invention relates, in general, to imaging systems. More specifically, the present invention relates to imaging systems with depth sensing capabilities and stereo perception, although using only a single sensor with a single lens.

BACKGROUND OF THE INVENTION

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals.

Some applications, such as three-dimensional (3D) imaging may require electronic devices to have depth sensing capabilities. For example, to properly generate a 3D image for a given scene, an electronic device may need to identify the distances between the electronic device and objects in the scene. To identify distances, conventional electronic devices use complex arrangements. Some arrangements require the use of multiple cameras with multiple image sensors and lenses that capture images from various viewpoints. These increase cost and complexity in obtaining good stereo imaging performance. Other arrangements require the addition of lenticular arrays that focus incident light on sub-regions of a two-dimensional pixel array. Due to the addition of components, such as complex lens arrays, these arrangements lead to reduced spatial resolution, increased cost and complexity.

The present invention, as will be explained, addresses an improved imager that obtains stereo performance using a single sensor with a single lens. Such imager reduces complexity and cost, and improves the stereo imaging performance.

BRIEF DESCRIPTION OF THE FIGURES

The invention may be best understood from the following detailed description when read in connection with the accompanying figures.

DETAILED DESCRIPTION OF THE INVENTION

Figure 1:
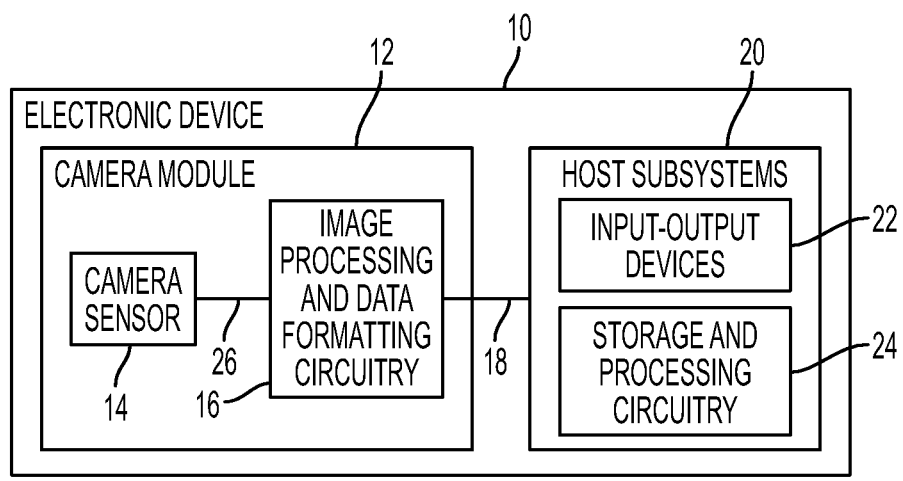
FIG. 1 is a schematic diagram of an electronic device with a camera sensor that may include depth sensing pixels, in accordance with an embodiment of the present invention.

An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (i.e., pixels) that convert the light into digital data. Image sensors may have any number of pixels (e.g., hundreds, thousands, millions, or more). As examples, image sensor 14 may include bias circuitry (e.g., source follower load circuits), sample and hold circuitry, correlated double sampling (CDS) circuitry, amplifier circuitry, analog-to-digital converter (ADC) circuitry, data output circuitry, memory (e.g., buffer circuitry), address circuitry, etc.

Still and video image data from camera sensor 14 may be provided to image processing and data formatting circuitry 16 via path 26. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files, if desired (e.g., to Joint Photographic Experts Group, or JPEG format). In a typical arrangement, which is sometimes referred to as a system-on-chip, or SOC arrangement, camera sensor 14 and image processing and data formatting circuitry 16 are implemented on a common integrated circuit. The use of a single integrated circuit to implement camera sensor 14 and image processing and data formatting circuitry 16 may help to minimize costs.

Camera module 12 (e.g., image processing and data formatting circuitry 16) conveys acquired image data to host subsystem 20 over path 18. Electronic device 10 typically provides a user with numerous high-level functions. In a computer or advanced cellular telephone, for example, a user may be provided with the ability to run user applications. To implement these functions, host subsystem 20 of electronic device 10 may have input-output devices 22, such as keypads, input-output ports, joysticks, displays, and storage and processing circuitry 24. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

It may be desirable to form image sensors with depth sensing capabilities (e.g., for use in 3D imaging applications, such as machine vision applications and other three dimensional imaging applications). To provide depth sensing capabilities, camera sensor 14 may include pixels such as pixels 100A, and 100B, shown in FIG. 2A.

Figure 2A:
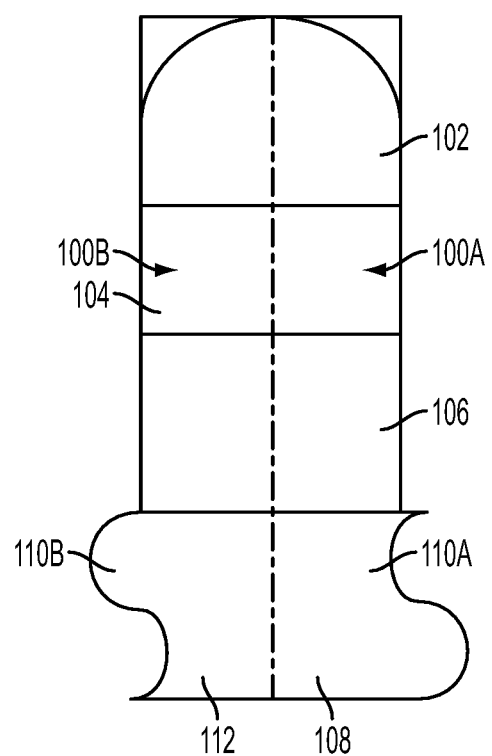
FIG. 2A is a cross-sectional view of a pair of depth sensing pixels covered by one microlens that has an asymmetric angular response, in accordance with an embodiment of the present invention.

FIG. 2A shows an illustrative cross-section of pixels 100A and 100B. Pixels 100A and 100B may contain microlens 102, color filter 104, a stack of dielectric layers 106, substrate layer 108, a photosensitive area, such as photosensitive area 110A and 110B formed in substrate layer 108, and pixel separating areas 112 formed in substrate layer 108.

Microlens 102 may direct incident light towards a substrate area between pixel separators 112. Color filter 104 may filter the incident light by only allowing predetermined wavelengths to pass through color filter 104 (e.g., color filter 104 may only be transparent to wavelengths corresponding to a green color). Photosensitive areas 110A and 110B may serve to absorb incident light focused by microlens 102 and produce image signals that correspond to the amount of incident light absorbed.

A pair of pixels 100A and 100B may be covered by one microlens 102. Thus, the pair of pixels may be provided with an asymmetric angular response (e.g., pixels 100A and 100B may produce different image signals based on the angle at which incident light reaches pixels 100A and 100B). The angle at which incident light reaches pixels 100A and 100B may be referred to herein as an incident angle, or angle of incidence.

Figure 2B:
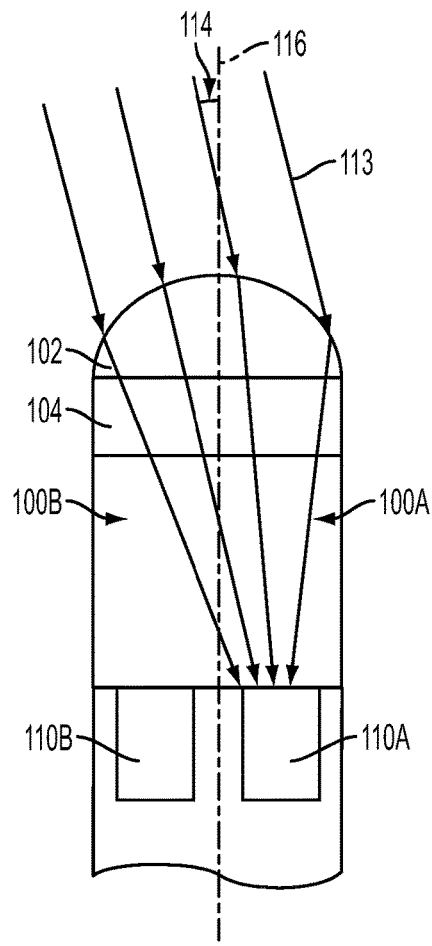
FIGS. 2B and 2C are cross-sectional views of a depth sensing pixel that may be asymmetrically sensitive to incident light at negative and positive angles of incidence, in accordance with an embodiment of the present invention.

In the example of FIG. 2B, incident light 113 may originate from the left of a normal axis 116 and may reach a pair of pixels 100A and 100B with an angle 114 relative to normal axis 116. Angle 114 may be a negative angle of incident light. Incident light 113 that reaches microlens 102 at a negative angle, such as angle 114, may be focused towards photosensitive area 110A, and pixel 100A may produce relatively high image signals.

Figure 2C:
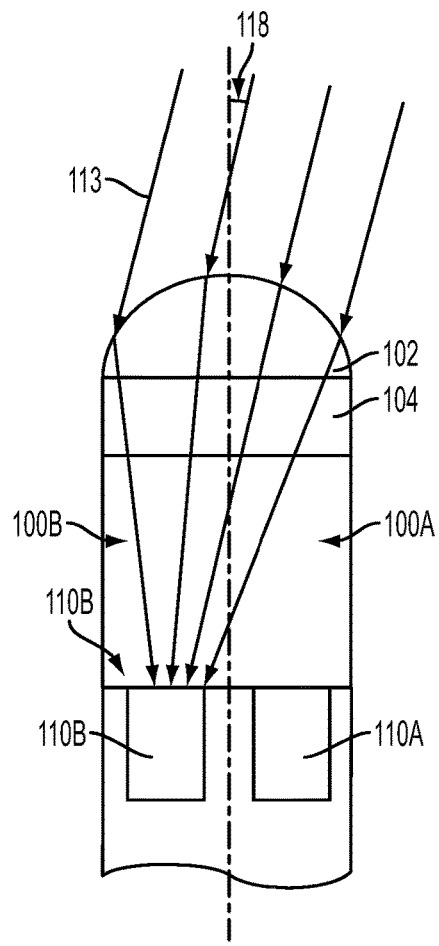

In the example of FIG. 2C, incident light 113 may originate from the right of normal axis 116 and reach the pair of pixels 100A and 100B with an angle 118 relative to normal axis 116. Angle 118 may be a positive angle of incident light. Incident light that reaches microlens 102 at a positive angle, such as angle 118, may be focused towards photosensitive area 110B. In this case, pixel 100B may produce an image signal output that is relatively high.

Figure 3:
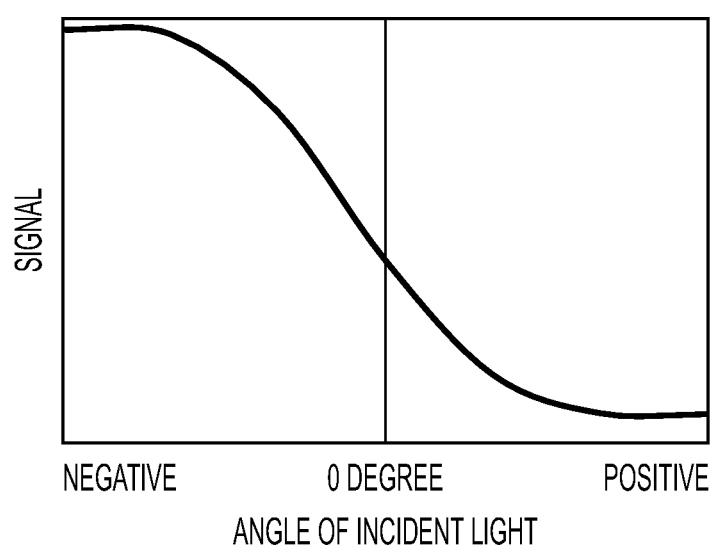
FIG. 3 is a diagram of illustrative output signals of a depth sensing pixel for incident light striking the depth sensing pixel at varying angles of incidence, in accordance with an embodiment of the present invention.

Due to the special formation of the microlens, pixels 100A and 100B may have an asymmetric angular response (e.g., pixel 100A and 100B may produce different signal outputs for incident light with a given intensity, based on an angle of incidence). In the diagram of FIG. 3, an example of the image output signals of pixel 100A in response to varying angles of incident light are shown. As shown, pixel 100A may produce larger image signals for negative angles of incident light and smaller image signals for positive angles of incident light. In other words, pixel 100A produces larger image signals as the incident angle becomes more negative.

Figure 2D:
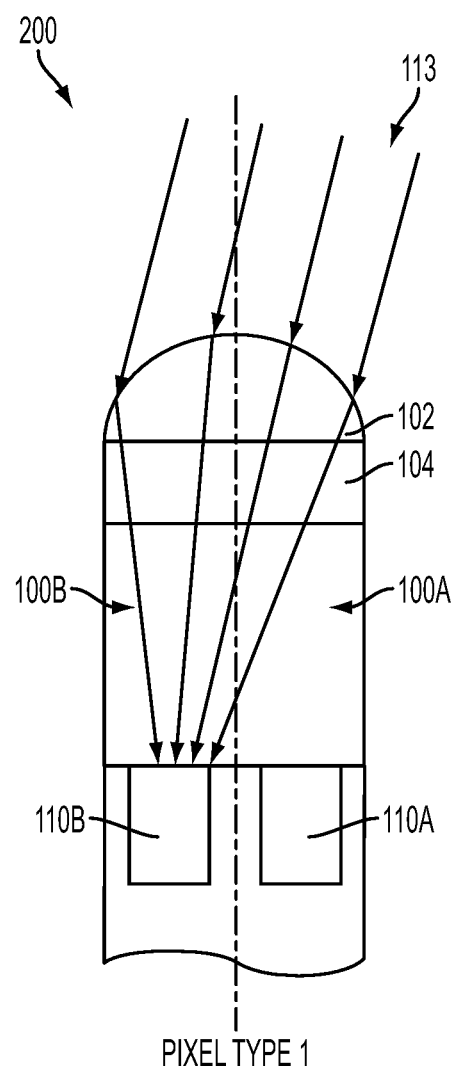
FIG. 2D shows a cross-sectional view and a top view of a pair of depth sensing pixels covered by one microlens, in accordance with an embodiment of the present invention.

FIG. 2D illustrates an adjacent pair of pixels (100A and 100B) with the same microlens, in which pixel 100A is formed on the right side of the pair, and pixel 100B is formed on the left side of the pair. An adjacent pair of pixels, such as pixels 100A and 100B, may be referred to herein as pixel pair 200. The pixel pair 200 may also be referred to herein as pixel type 1 and pixel type 2.

Incident light 113 that reaches pair of pixels 100A and 100B may have an angle of incidence that is approximately equal for both pixels. In the arrangement of FIG. 2D, incident light 113 may be focused by microlens 102A onto photosensitive area 110B in pixel 100A and photosensitive area 110B in pixel 100B. In response to receiving incident light 113, pixel 100A may produce an output image signal that is high and pixel 100B may produce an output image signal that is high by the microlens design.

Figure 4:
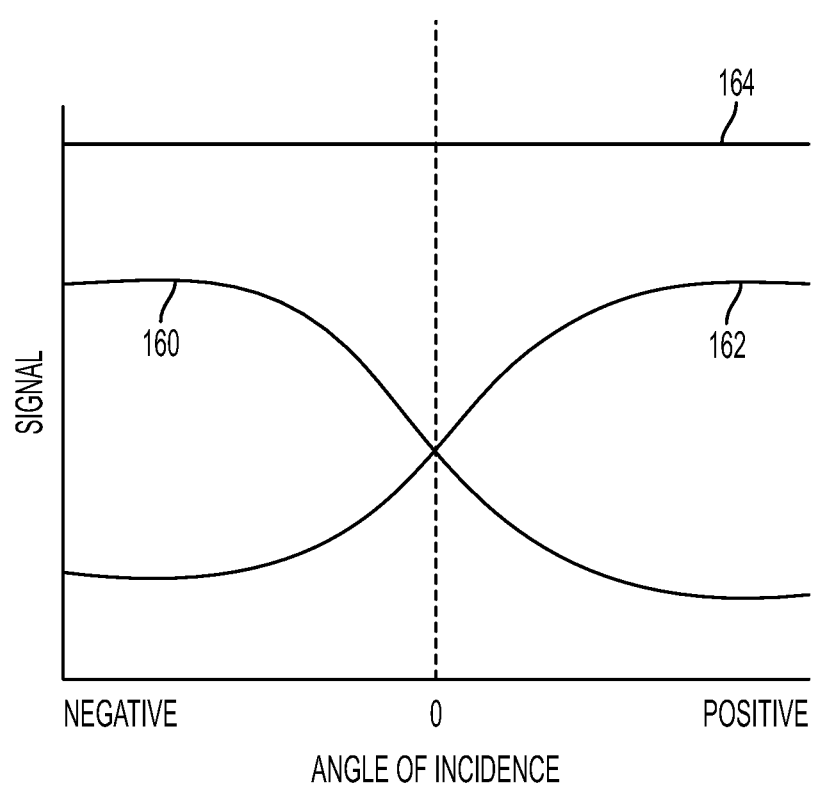
FIG. 4 is a diagram of illustrative output signals of depth sensing pixels in a depth sensing pixel pair for incident light striking the depth sensing pixel pair at varying angles of incidence, in accordance with an embodiment of the present invention.

The respective output image signals for pixel pair 200 (e.g., pixels 100A and 100B) are shown in FIG. 4. As shown, line 160 may reflect the output image signal for pixel 100A and line 162 may reflect the output image signal for pixel 100B. For negative angles of incidence, the output image signal for pixel 100A may increase (because incident light is focused onto photosensitive area 110A of pixel 100A) and the output image signal for pixel 100B may decrease (because incident light is focused away from photosensitive area 110B of pixel 100B). For positive angles of incidence, the output image signal for pixel 100A may be relatively small and the output image signal for pixel 100B may be relatively large (e.g., the output signal from pixel 100A may decrease and the output signal from pixel 100B may increase).

Line 164 of FIG. 4 may reflect the sum of the output signals for pixel pair 200. As shown, line 164 may remain relatively constant regardless of the angle of incidence (e.g., for any given angle of incidence, the total amount of light that is absorbed by the combination of pixels 100A and 100B may be constant).

Figure 5A:
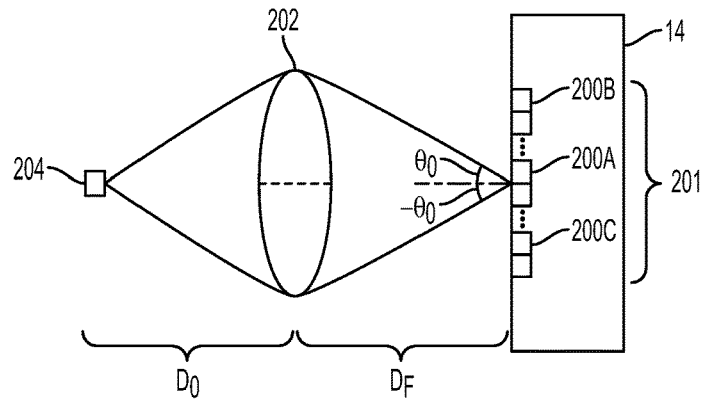
FIG. 5A is a diagram of a depth sensing imager having a lens and an object located at a focal distance away from the lens, showing how the lens focuses light from the object onto the depth sensing imager, in accordance with an embodiment of the present invention.
Figure 5B:
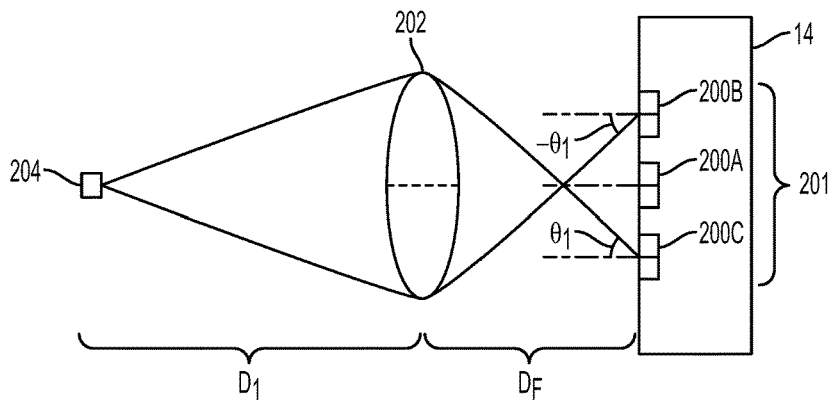
FIG. 5B is a diagram of a depth sensing imager having a lens and an object located at more than a focal distance away from the lens, showing how the lens focuses light from the object onto the depth sensing imager, in accordance with an embodiment of the present invention.
Figure 5C:
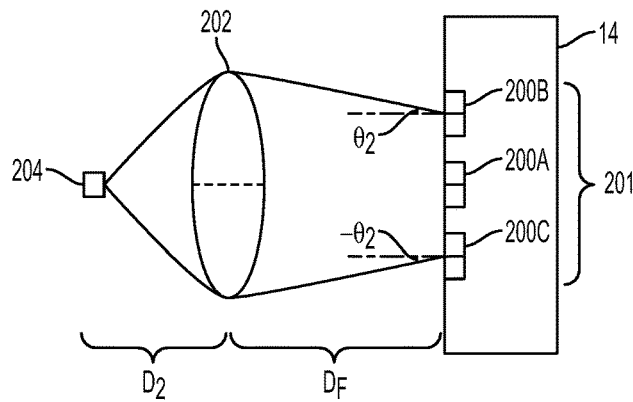
FIG. 5C is a diagram of a depth sensing imager having a lens and an object located less than a focal distance away from the imaging lens, showing how the lens focuses light from the object onto the depth sensing imager, in accordance with an embodiment of the present invention.

Pixel pairs 200 may be used to form imagers with depth sensing capabilities. FIGS. 5A, 5B and 5C show illustrative image sensors 14 with depth sensing capabilities. As shown, image sensor 14 may contain an array of pixels 201 formed from pixel pairs 200 (e.g., pixel pairs 200A, 200B, 200C, etc.). Image sensor 14 may have an associated camera lens 202 that focuses light originating from a scene of interest (e.g., a scene that includes an object 204) onto the array of pixels. Camera lens 202 may be located at a distance $D_F$ from image sensor 14. Distance $D_F$ may correspond to the focal length of camera lens 202.

In the arrangement of FIG. 5A, object 204 may be located at distance $D_0$ from camera lens 202. Distance $D_0$ may correspond to a focused object plane of camera lens 202 (e.g., a plane located at a distance $D_0$ from camera lens 202). The focused object plane and a plane corresponding to image sensor 14 may sometimes be referred to as conjugate planes. In this case, light from object 204 may be focused onto pixel pair 200A, at an angle $\theta_0$ and an angle $-\theta_0$. The image output signals of pixels 100A and 100B of pixel pair 200 may be equal (e.g., most of the light is absorbed by pixel 100A for the positive angle and most of the light is absorbed by pixel 100B for the negative angle).

In the arrangement of FIG. 5B, object 204 may be located at a distance $D_1$ from camera lens 202. Distance $D_1$ may be larger than the distance of the focused object plane (e.g., the focused object plane corresponding to distance $D_0$) of camera lens 202. In this case, some of the light from object 204 may be focused onto pixel pair 200B at a negative angle $-\theta_1$ (e.g., the light focused by the bottom half pupil of camera lens 202) and some of the light from object 204 may be focused onto pixel pair 200C at a positive angle $\theta_1$ (e.g., the light focused by the top half pupil of camera lens 202).

In the arrangement of FIG. 5C, object 204 may be located at a distance $D_2$ from camera lens 202. Distance $D_2$ may be smaller than the distance of the focused object plane (e.g., the focused object plane corresponding to distance $D_0$) of camera lens 202. In this case, some of the light from object 204 may be focused by the top half pupil of camera lens 202 onto pixel pair 200B at a positive angle $\theta_2$ and some of the light from object 204 may be focused by the bottom half pupil of camera lens 202 onto pixel pair 200C at a negative angle $-\theta_2$.

The arrangements of FIGS. 5A, 5B and 5C may effectively partition the light focused by camera lens 202 into two halves split by a center plane at a midpoint between the top of the lens pupil and the bottom of the lens pupil (e.g., split into a top half and a bottom half). Each pixel in the paired pixel array 201 may receive different amounts of light from top or bottom half of the lens pupil, respectively. For example, for an object at distance $D_1$, pixel 100A of 200B may receive more light than pixel 100B of 200B. For an object at distance $D_2$, pixel 100A of 200B may receive less light than 100B of 200B. The partitioning of the light focused by camera lens 202 may be referred to herein as lens partitioning, or lens pupil division.

The output image signals of each pixel pair 200 of image sensor 14 may depend on the distance from camera lens 202 to object 204. The angle at which incident light reaches pixel pairs 200 of image sensor 14 depends on the distance between lens 202 and objects in a given scene (e.g., the distance between objects such as object 204 and device 10).

Figure 6:
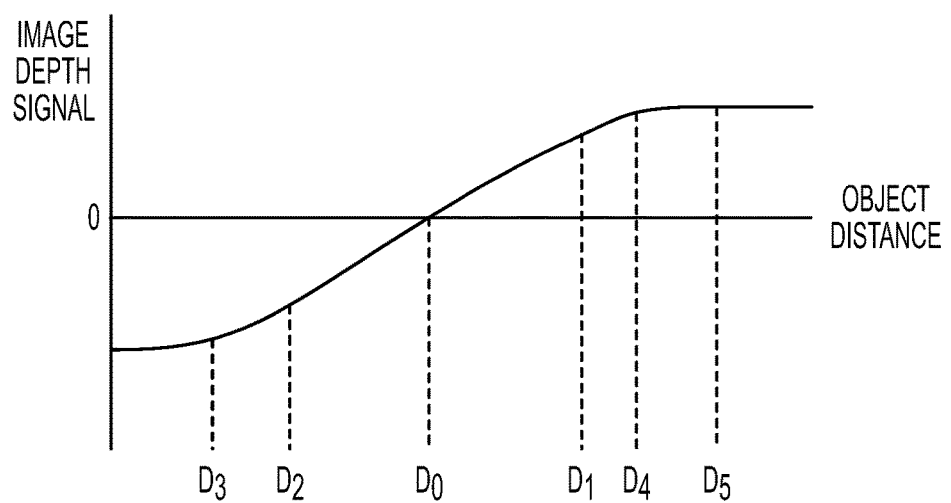
FIG. 6 is a diagram of illustrative depth output signals of a depth sensing pixel pair for an object at varying distances from the depth sensing pixel, in accordance with an embodiment of the present invention.

An image depth signal may be calculated from the difference between the two output image signals of each pixel pair 200. The diagram of FIG. 6 shows an image depth signal that may be calculated for pixel pair 200B by subtracting the image signal output of pixel 100B from the image signal output of pixel 100A (e.g., by subtracting line 162 from line 160 of FIG. 4). As shown in FIG. 6, for an object at a distance that is less than distance $D_0$, the image depth signal may be negative. For an object at a distance that is greater than the focused object distance $D_0$, the image depth signal may be positive.

For distances greater than $D_4$ and less than $D_3$, the image depth signal may remain constant. Pixels 100A and 100B may be unable to resolve incident angles with magnitudes larger than the magnitudes of angles provided by objects at distances greater than $D_4$, or at distances less than $D_3$. In other words, a depth sensing imager may be unable to accurately measure depth information for objects at distances greater than $D_4$, or at distances less than $D_3$. The depth sensing imager may be unable to distinguish whether an object is at a distance $D_4$ or a distance $D_5$ (as an example). If desired, the depth sensing imager may assume that all objects that result in an image depth signal equivalent to distance $D_2$ or $D_4$ are at a distance of $D_2$ or $D_4$, respectively.

To provide an imager 14 with depth sensing capabilities, two dimensional pixel arrays 201 may be formed from various combinations of depth sensing pixel pairs 200 and regular pixels (e.g., pixels without asymmetric angular responses). For a more comprehensive description of two dimensional pixel arrays 201, with depth sensing capabilities and with regular pixels (e.g., pixels without asymmetric angular responses), reference is made to Application Ser. No. 13/188,389, filed on Jul. 21, 2011, titled Imagers with Depth Sensing Capabilities, having common inventors. That application is incorporated herein by reference in its entirety.

It should be understood that the depth sensing pixels may be formed with any desirable types of color filters. Depth sensing pixels may be formed with red color filters, blue color filters, green color filters, or color filters that pass other desirable wavelengths of light, such as infrared and ultraviolet light wavelengths. If desired, depth sensing pixels may be formed with color filters that pass multiple wavelengths of light. For example, to increase the amount of light absorbed by a depth sensing pixel, the depth sensing pixel may be formed with a color filter that passes many wavelengths of light. As another example, the depth sensing pixel may be formed without a color filter (sometimes referred to as a clear pixel).

Figure 7:
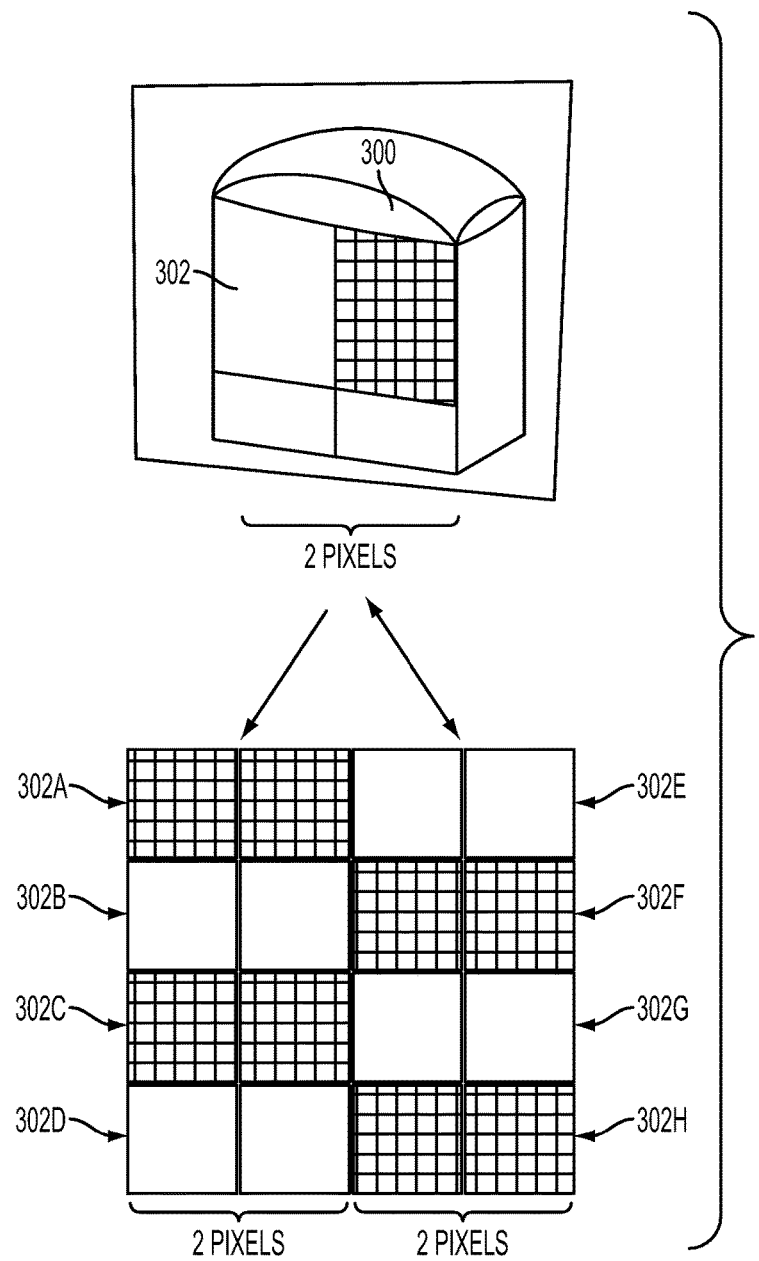
FIG. 7 is a perspective view of one microlens covering two depth sensing pixels, in accordance with an embodiment of the present invention.

Referring now to FIG. 7, there is shown a perspective view of an embodiment of the present invention. The pixel pair 302 is similar to the pixel pair 200 shown in FIG. 2D. The pixel pair includes left and right pixels, or as sometimes referred to as pixel type-one and pixel type-two. As shown in FIG. 7, a single microlens 300 (same as 102 in FIG. 2D) is positioned above the left and right pixels so that the single microlens spans across both pixels in the horizontal direction.

Figure 8:
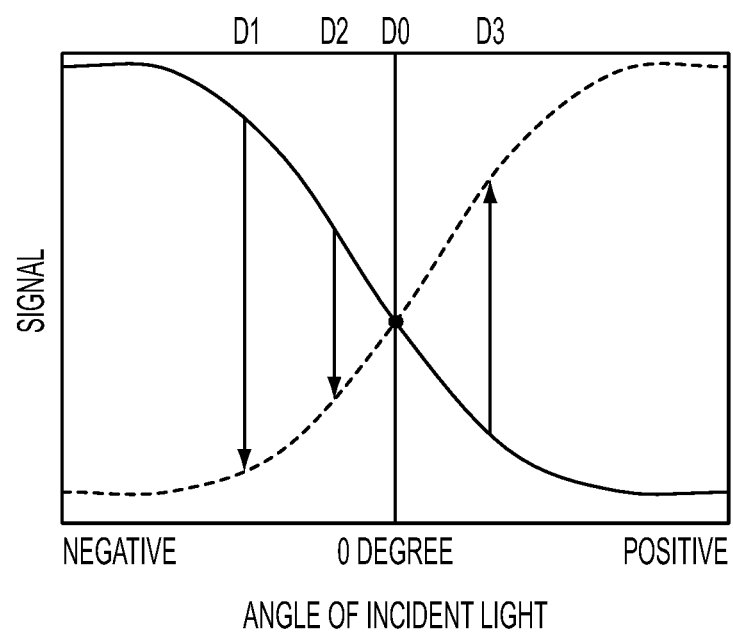
FIG. 8 is a diagram showing a top view of two sets of two depth sensing pixels of FIG. 7 arranged in a Bayer pattern, in accordance with an embodiment of the present invention.

Several pixel pairs 302 are shown in FIG. 8. Each pixel pair includes a single color filter of a CFA (color filter array) that forms a Bayer pattern. Pixel pair 302A forms two color filters for green. Pixel pair 302B forms two color filters for blue. Pixel pair 302C forms two green filters. Similarly, pixel pairs 302D, 302E, 302F, 302G and 302H form pairs of color filters producing a Bayer pattern.

Figure 9:
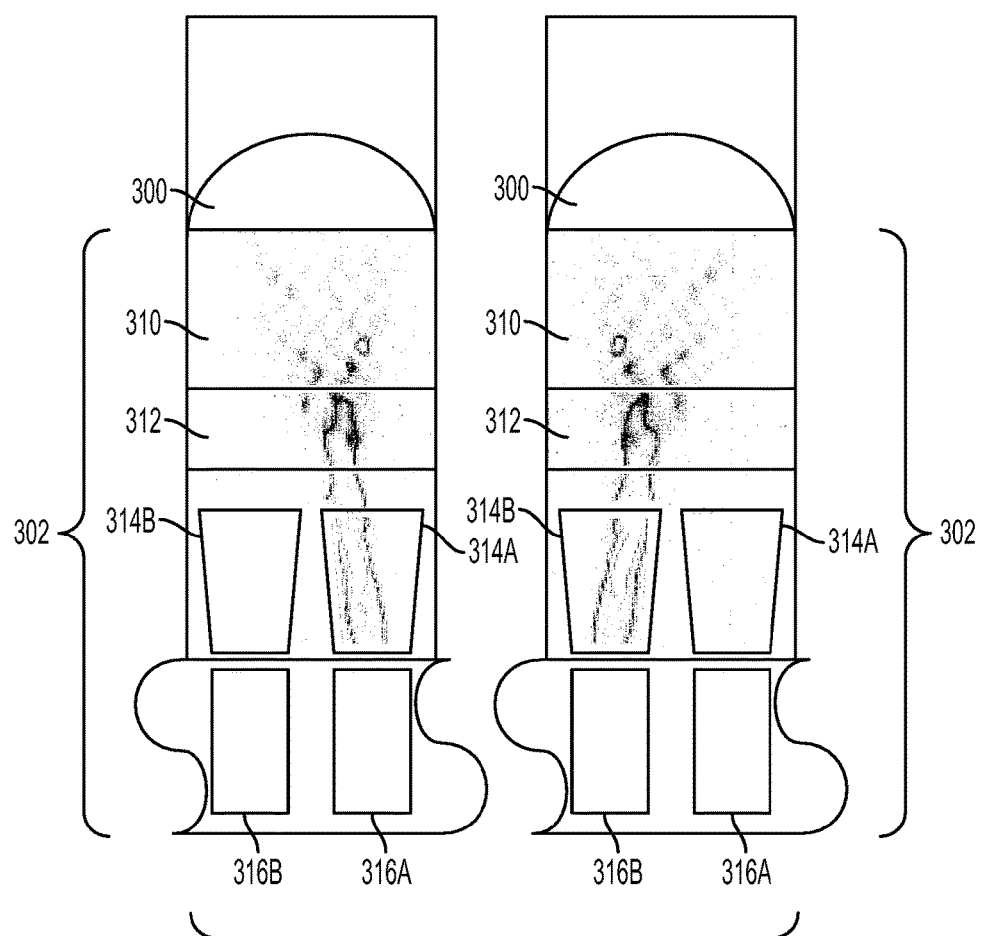
FIG. 9 is diagram of a cross-sectional view of two sets of two depth sensing pixels, showing light entering one light pipe (LP) in each set, in accordance with an embodiment of the present invention.

Referring now to FIG. 9, there is shown an asymmetric pixel configuration that includes microlens 300 and pixel pair 302, similar to the pixel configuration of FIG. 7. It will be appreciated that FIG. 9 shows four pixels, namely, pixels 316A and 316B forming one pair of pixels on the left side of the figure and pixels 316A and 316B forming another pair of pixels on the right side of the figure. As shown, each microlens 300 covers two pixels in the horizontal direction. A planarization layer 310 is disposed under each microlens 300. Below planarization layer 310, there is shown a color filter which spans across two pixels 316A and 316B. Thus, color filter 312 is similar in length to the length of microlens 300 and covers a pixel pair (or a set of pixels).

Disposed between each color filter 312 and each pixel pair 316A and 316B are two light pipes (LPs). Each LP improves the light concentration that impinges upon each respective pixel. The LP improves, not only the light concentration, but also reduces cross-talk and insures good three dimensional performance, even with very small pixel pitches, such as 1.4 microns or less.

As shown on the left side of FIG. 9, light enters pixel photosensitive area 316B by way of LP 314B. Similarly, on the right side of FIG. 9, light enters LP 314A and pixel photosensitive area 316A. It will be appreciated that LP 314B, on the left side of the figure, includes most of the light, because the light passing through microlens 300 is angled at a negative angle with respect to a vertical line through microlens 300. In a similar way, the light on the right side of the figure, enters LP 314A, because the light passing through microlens 300 is angled at a positive angle with respect to a vertical line through microlens 300.

Figure 10:
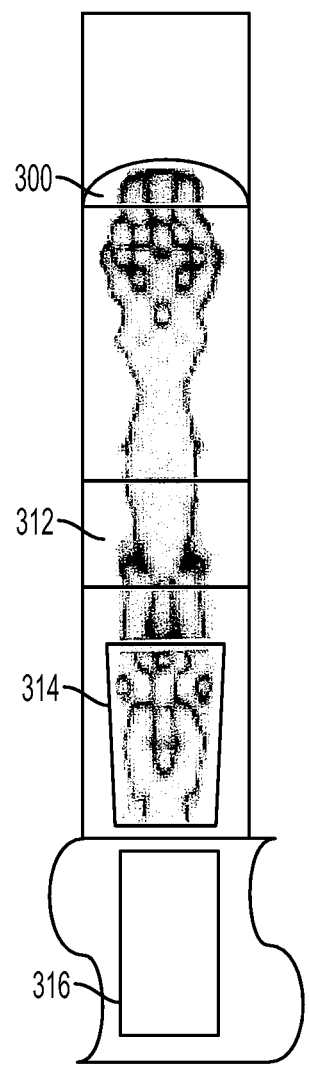
FIG. 10 is diagram of a side view of the two sets of two depth sensing pixels shown in FIG. 9.

FIG. 10 shows the same pixels as in FIG. 9, except that a side-view is shown of the pixel pair. As shown, microlens 300 only spans one pixel in the vertical direction, or the column direction of a pixel array. Accordingly, microlens 300 is effective in reducing cross-talk in the vertical direction of the pixel array. Also shown in the figure is a side-view of LP 314 and pixel photosensitive area 316. In addition, light is shown concentrated in LP 314 and passing into pixel photosensitive area 316.

Figure 11:
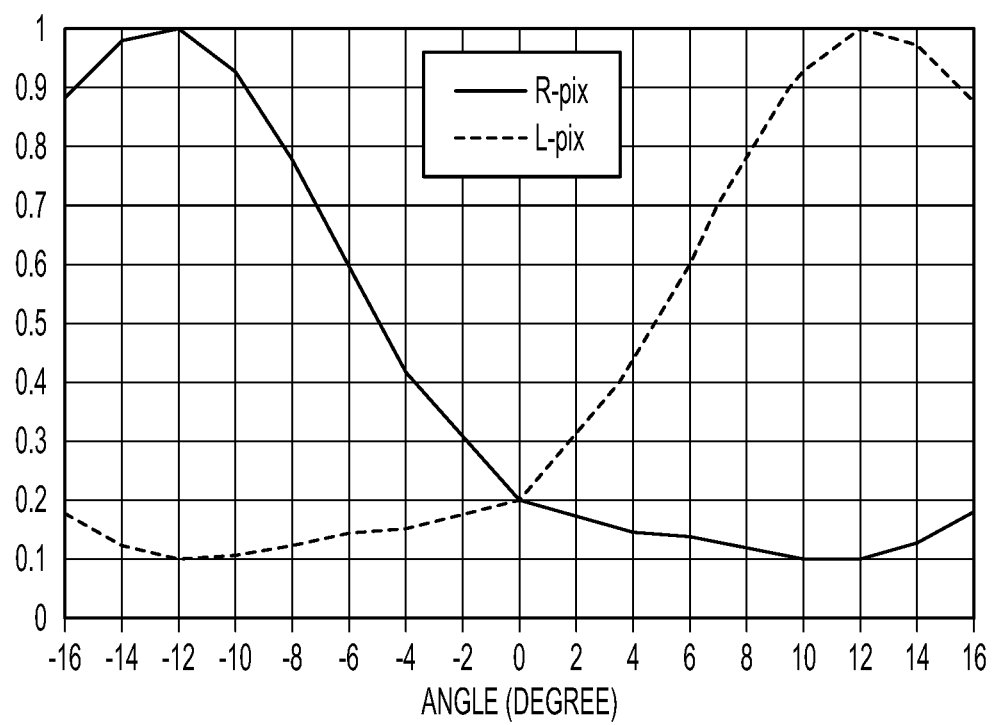
FIG. 11 is plot of the relative signal response versus the incident angle of light entering left and right pixels in each set of pixels shown in FIG. 9, in accordance with an embodiment of the present invention.

FIG. 11 shows the relative signal response versus the incident angle of light entering a pixel pair. As shown, the right pixel (or pixel 314B on the left side of FIG. 9) responds strongly, when the light enters at a negative angle with respect to a vertical line passing through microlens 300. On the other hand, when the left pixel (or pixel 314A on the right side of FIG. 9) receives light at a positive angle with respect to a normal passing through microlens 300, the pixel also responds strongly. At normal incidence, however, the responses of the left and right pixels are relatively low. It will be appreciated that if the two pixels forming each pixel pair is summed in the horizontal direction, a normal image may be formed. On the other hand, since the left and right pixels form asymmetric pixel angular responses, the present invention obtains depth sensing capabilities.

Figure 12:
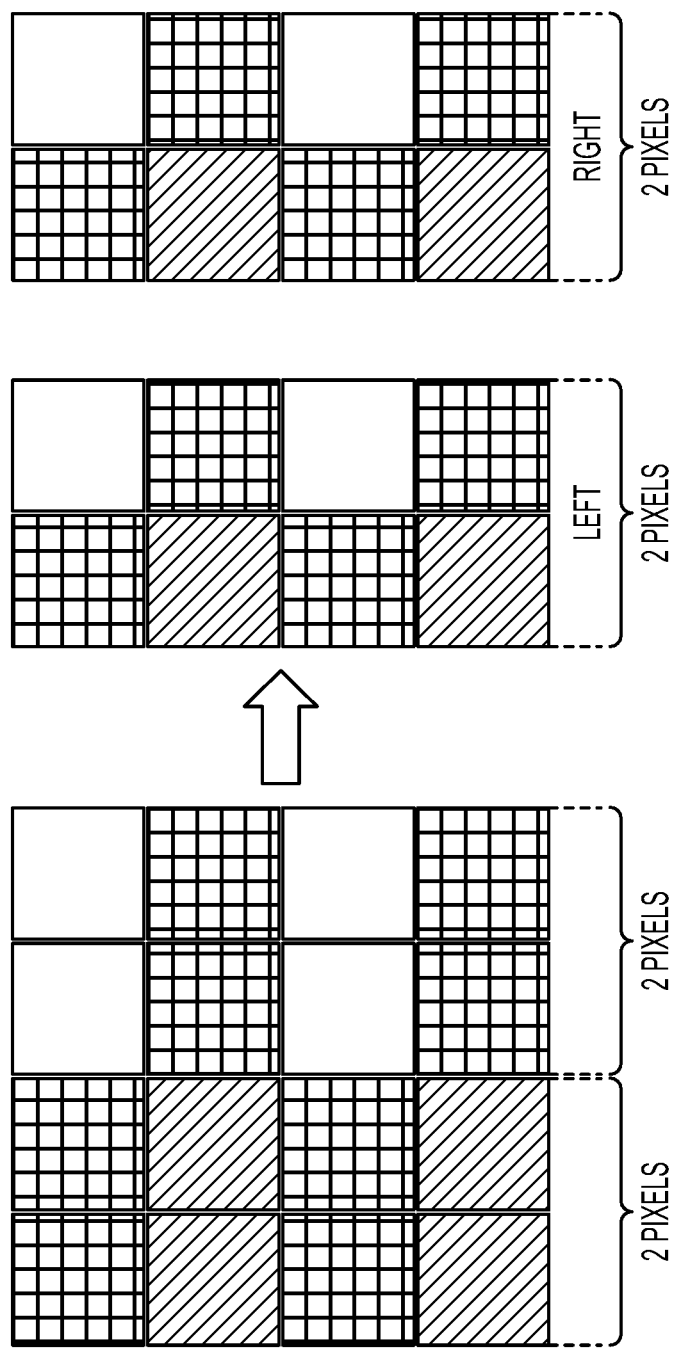
FIG. 12 is a top view of sets of left and right pixels arranged in a Bayer pattern, in accordance with an embodiment of the present invention.

It will now be understood that an asymmetric angular response stereo sensor is provided by the present invention. By having a 2×1 CFA pattern, as shown in FIG. 8, the present invention may process the color normally for two separate images and obtain two separate Bayer patterns, as shown in FIG. 12. Accordingly, the two pixel pairs shown on the left side of FIG. 12 may be separated into two images (the left image has two pixels and the right image has two pixels).

For example, the first pixel pair provides a green color; when the pair is separated into left and right images, the present invention provides a single green pixel for the left image and a single green pixel for the right image. Similarly, when the two right pixels providing red colors are separated into left and right images, the present invention forms a left image with a red color and a right image with a red color. Thus, a 2×1 CFA pattern enables the present invention to form a normal Bayer color process for two separate images (left and right Bayer images), as shown in FIG. 12.

Figure 13A:
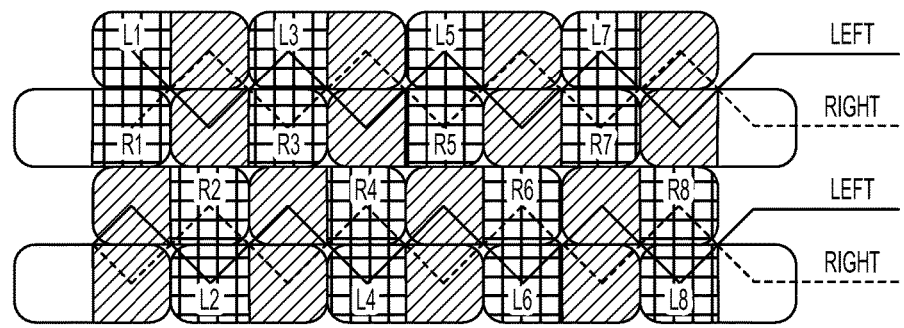
FIGS. 13A and 13B are top views of sets of left and right pixels arranged differently so that each forms a Bayer pattern, in accordance with an embodiment of the present invention.
Figure 13B:
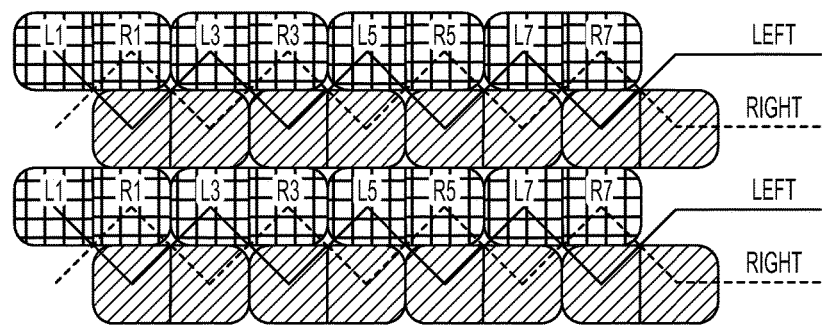

Referring next to FIGS. 13A and 13B, there are shown two different CFA/microlens arrangements, namely arrangement 1 in FIG. 13A and arrangement 2 in FIG. 13B. It will be appreciated that each arrangement includes microlenses that cover 2×1 pixels, as shown in FIG. 7. The microlenses, however, are shown zigzag-shifted relative to each other by one pixel in neighboring rows. These arrangement result in no resolution loss in the horizontal direction and would be valuable for HD video format.

In arrangement 1 shown in FIG. 13A, the first and second rows' CFA pattern is GRGRGR . . . , and the third and fourth rows' CFA patterns is BGBGBG . . . . The 2×1 microlens for the first and third rows start from the first column, whereas the microlens for the second and fourth rows start one column earlier, or later. Therefore, the left image pixel array is formed by pixels L1, L2, L3, L4, L5, L6, L7 and L8. Similarly, the right image pixel array is formed by pixels R1, R2, R3, R4, R5, R6, R7 and R8. The first Bayer pattern for the left image is formed by Gr=L1 in the first row, R=L2 in the second row, B=L1 in the third row, and Gb=L2 in the fourth row. The first Bayer pattern for the right image is formed by Gr=R1 in the second row, R=R2 in the first row, B=R1 in the fourth row, and Gb=R2 in the third row.

In arrangement 2, shown in FIG. 13B, the first and third rows are an all green CFA, the second row is an all red CFA, and the fourth row is an all blue CFA. The 2×1 microlens for the first and third rows start from the first column, whereas the microlens for second and fourth rows start one column earlier, or later. Therefore, the left image pixel array is formed by pixels L1, L2, L3, L4, L5, L6, L7 and L8. Similarly, the right image pixel array is formed by pixels R1, R2, R3, R4, R5, R6, R7 and R8. The first Bayer pattern for the left image is formed by Gr=L1 in the first row, R=L2 in the second row, Gb=L1 in the third row, and B=L2 in the fourth row. The first Bayer pattern for the right image is formed by Gr=R1 in the first row, R=R2 in the second row, Gb=R1 in the third row and B=R2 in the fourth row.

Referring again to FIG. 9 and FIG. 10, it will be understood that each microlens covers two pixels in the horizontal direction, but only covers one pixel in the vertical direction. Furthermore, the radius of curvature of each microlens in both directions are different due to processing limitations. The microlens material includes an optical index (n) that varies in range between 1.5 and 1.6. Furthermore, the LP may be filled by material having a higher optical index (n greater than 1.6) than its surrounding oxide material, in which the latter may have an optical index of 1.4 or 1.5. In this manner, the light is maintained within the LP.

Although the invention is illustrated and described herein with reference to specific embodiments, the invention is not intended to be limited to the details shown. Rather, various modifications may be made in the details within the scope and range of equivalents of the claims and without departing from the invention.

What is claimed:
1. Depth sensing imaging pixels comprising:
first and second adjacent photosensitive elements having an asymmetrical angular response to incident light;
a single microlens positioned above the first and second adjacent photosensitive elements;
a first color filter of a first color interposed between the single microlens and the first photosensitive elements;
a second color filter of a second color that is different than the first color interposed between the single microlens and the second photosensitive element;
a first light pipe disposed between the first photosensitive element and the single microlens for directing the incident light toward the first photosensitive element; and a second light pipe disposed between the second photosensitive element and the single microlens for directing the incident light toward the second photosensitive element, wherein:
  the first light pipe is configured to receive the incident light at a relatively high signal response when the incident light forms a positive angle with respect to a vertical plane passing between the first and second adjacent photosensitive elements; and
  the second light pipe is configured to receive the incident light at a relatively high signal response when the incident light forms a negative angle with respect to a vertical plane passing between the first and second adjacent photosensitive elements.

2. The imaging pixels of claim 1 wherein the single microlens has a length that is substantially twice the length of either the first or second photosensitive element in a horizontal direction, the single microlens has a width that is substantially the same as a width of either the first or second photosensitive element in a vertical direction, and the horizontal and vertical directions are horizontal and vertical directions of a planar image array.

3. The imaging pixels of claim 2 wherein the single microlens has a radius of curvature in the horizontal direction that is the different from its radius of curvature in the vertical direction.

4. The imaging pixels of claim 1 wherein the color filter has a length that is substantially twice the length of either the first or second photosensitive element in a horizontal direction, the color filter has a width that is substantially the same as a width of either the first or second photosensitive element in the vertical direction, and the horizontal and vertical directions are horizontal and vertical directions of a planar image array.

5. The imaging pixels of claim 1 wherein
  the first and second light pipes include material of a refractive index greater than a refractive index of material external of the first and second light pipes.

6. An imaging array comprising:
  multiple pixel pairs of left and right pixels, wherein each pixel pair comprises depth sensing pixels having asymmetrical angular responses to incident light;
  multiple color filter elements disposed on top of the multiple pixel pairs, wherein each color filter element comprises a single color and spans completely across the left and right pixels in each pixel pair;
  microlenses that each span one pixel pair, wherein the microlenses are formed over the multiple color filter elements, wherein each microlens of the microlenses has a width and a length, and wherein the length of each microlens is longer than the width of that microlens; and
  image processing circuitry configured to obtain an image depth signal by using subtraction to determine a difference between an output signal from a first one of the left pixels and an output signal from a first one of the right pixels.

7. The imaging array of claim 6 wherein the multiple pixel pairs are configured to provide one of the following:
  (a) two separate images, one image derived from left pixels and the other image derived from right pixels, and
  (b) a single image upon summing respective left and right pixels in each of the multiple pixel pairs.

8. The imaging array of claim 6, wherein each microlens covers 2×1 pixels, defining two pixels in a row and one pixel in a column.

9. The imaging array of claim 8 wherein each microlens in a row is shifted by one pixel relative to each microlens in a neighboring row.

10. The imaging array of claim 9 wherein
  two separate patterns are formed, in which left and right image arrays are formed from neighboring four rows.

11. The imaging array of claim 6 including
  multiple light pipes disposed between the multiple pixel pairs and multiple color filters,
  wherein each light pipe is configured to direct the incident light toward one of either a left pixel or a right pixel.

12. The imaging pixels of claim 1 wherein the first and second photosensitive elements are configured to detect distance.

13. The imaging array of claim 6, further comprising:
  additional pixels having symmetrical angular responses to the incident light.

14. The imaging array of claim 6, wherein the first one of the left pixels and the first one of the right pixels are positioned in the same row of pixels.

15. The imaging array of claim 6, wherein the first one of the left pixels and the first one of the right pixels form a first pixel pair of the multiple pixel pairs.

16. An imaging array comprising:
  a pixel pair that includes a left pixel and a right pixel, wherein the left pixel and the right pixel are depth sensing pixels having asymmetrical angular responses to incident light;
  a color filter element disposed on top of the pixel pair, wherein the color filter element comprises a single color and spans completely across the left and right pixels in the pixel pair;
  a microlens that spans the pixel pair, wherein the microlens is formed over the color filter element; and
  image processing circuitry configured to:
    obtain an image depth signal by using subtraction to determine a difference between an output signal from the left pixel of the pixel pair and an output signal from the right pixel of the pixel pair; and
    determine a distance to an imaged object based on the image depth signal.

17. The imaging array of claim 16, wherein the microlens has a length and a width and wherein the length is substantially twice the width.

18. The imaging array of claim 6, wherein the length of each microlens is twice as long as the width of that microlens.

19. The imaging array defined in claim 6, wherein the image processing circuitry is configured to form a first image based on output signals from each left pixel of the multiple pixel pairs and wherein the image processing circuitry is configured to form a second image that is separate from the first image based on output signals from each right pixel of the multiple pixel pairs.

* * * * *